(12) United States Patent
Ellis et al.

(10) Patent No.: US 11,347,581 B2
(45) Date of Patent: May 31, 2022

(54) SYSTEM FOR ACCELERATED TRAINING OF BIT OUTPUT TIMINGS

(71) Applicant: WESTERN DIGITAL TECHNOLOGIES, INC., San Jose, CA (US)

(72) Inventors: Robert Ellis, Phoenix, AZ (US); Atif Hussain, Denver, CO (US); Venugopal Garuda, Denver, CO (US); Kevin O'Toole, Chandler, AZ (US); Todd Lindberg, Phoenix, AZ (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 227 days.

(21) Appl. No.: 16/859,494

(22) Filed: Apr. 27, 2020

(65) Prior Publication Data

US 2021/0334028 A1    Oct. 28, 2021

(51) Int. Cl.
| | | |
|---|---|---|
| *G06F 11/00* | (2006.01) | |
| *G06F 11/10* | (2006.01) | |
| *G06F 3/06* | (2006.01) | |
| *G06F 11/07* | (2006.01) | |
| *G06F 13/16* | (2006.01) | |

(52) U.S. Cl.
CPC ........ *G06F 11/1028* (2013.01); *G06F 3/0604* (2013.01); *G06F 3/0647* (2013.01); *G06F 3/0679* (2013.01); *G06F 11/0727* (2013.01); *G06F 11/0751* (2013.01); *G06F 13/1678* (2013.01)

(58) Field of Classification Search
None
See application file for complete search history.

(56) References Cited

U.S. PATENT DOCUMENTS

| | | |
|---|---|---|
| 7,373,583 B2 | 5/2008 | Hummler |
| 7,634,702 B2 | 12/2009 | Kim et al. |
| 7,900,100 B2 | 3/2011 | Gollub |
| 10,242,750 B2 | 3/2019 | Linnen et al. |
| 10,347,347 B1 | 7/2019 | Srivastava et al. |
| 10,366,023 B2 | 7/2019 | Kim et al. |

(Continued)

OTHER PUBLICATIONS

Google Scholar/Patents—text refined (Year: 2021).*

*Primary Examiner* — Christopher S McCarthy
(74) *Attorney, Agent, or Firm* — Arentfox Schiff LLP (57) ABSTRACT

Aspects of a storage device including a controller memory, a die memory, and a plurality of accumulators corresponding to individual DQs are provided for accelerated DQ training and error detection. A controller stores first data in the controller memory, transfers second data to the die memory over an n-bit bus, and receives n bits of the second data from the die memory based on a DQS. The controller then compares n bits of the first data with n bits of the second data to produce n bit results received into respective accumulators, and the controller simultaneously updates different accumulators in response to bit mismatches. During DQ training, if an accumulator value meets a mismatch threshold, the controller modifies a DQS-DQ timing accordingly. During error detection of a read scrambled page, if an accumulator value does not meet an entropy threshold, the controller identifies an error associated with the page.

20 Claims, 7 Drawing Sheets

(56) References Cited

U.S. PATENT DOCUMENTS

| | | | |
|---|---|---|---|
| 2005/0180206 A1* | 8/2005 | Randell | G06F 13/1678 365/185.01 |
| 2014/0223270 A1* | 8/2014 | Gauvin | G06F 11/0763 714/824 |
| 2020/0117540 A1* | 4/2020 | Boehm | G11C 11/409 |

* cited by examiner

SYSTEM FOR ACCELERATED TRAINING OF BIT OUTPUT TIMINGS

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

A die of the flash storage device may include a number of input-outputs (e.g. DQ lines or pins) interfacing with a controller of the flash storage device. Each DQ line (hereinafter "DQ") may carry one bit over a shared n-bit bus between the die and the controller. For example, a flash storage device with an 8-bit bus may include eight DQs from which a controller may read individual bytes from the flash memory of a die. The flash storage device may read data from and write to the flash memory in synchronization with a periodic data strobe (e.g. DQS), which the controller toggles whenever data is ready to be read or written. For example, when the controller toggles DQS from a logic 0 to a logic 1, the controller may read a first byte from the 8 DQs while the DQS remains at logic 1, and when the controller toggles DQS from the logic 1 back to the logic 0, the controller may read a second byte from the 8 DQS while the DQS remains at logic 0, repeating byte-by-byte. Thus, in the example above, two bytes may be read during a DQS duty cycle (i.e. one byte during the first half (50%) of a DQS duty cycle, and another byte during the second half (50%) of the DQS duty cycle).

SUMMARY

One aspect of a storage device is disclosed herein. The storage device includes a controller memory, a die memory, a controller, and a plurality of accumulators including a first accumulator and a second accumulator. The controller is configured to store first data in the controller memory, to transfer second data to the die memory over a bus having an n-bit width, and to compare n bits of the first data with n bits of the second data to produce n bit results. The plurality of accumulators each correspond to one of the n bit results. The controller is further configured to update the first accumulator in response to a first one of the n bit results indicating a first mismatch, and to simultaneously update the second accumulator in response to a second one of the n bit results indicating a second mismatch.

Another aspect of a storage device is disclosed herein. The storage device includes a controller memory, a die memory, a controller, and a plurality of accumulators including a first accumulator and a second accumulator. The controller is configured to store first data in the controller memory, to transfer second data to the die memory over a bus having an n-bit width, to receive n bits of the second data from the die memory based on a data strobe, and to compare n bits of the first data with n bits of the second data to produce n bit results. The plurality of accumulators each correspond to one of the n bit results. The controller is further configured to update the first accumulator in response to a first one of the n bit results indicating a first mismatch, and to simultaneously update the second accumulator in response to a second one of the n bit results indicating a second mismatch. In this aspect, the data strobe is offset with respect to a first one of the n bits of the second data by a first timing, and the data strobe is offset with respect to a second one of the n bits of the second data by a second timing. Accordingly, the controller is also configured to determine whether a first value of the first accumulator or a second value of the second accumulator meet a mismatch threshold, to modify the first timing when the first value meets the mismatch threshold, and to modify the second timing when the second value meets the mismatch threshold.

A further aspect of a storage device is disclosed herein. The storage device includes a controller memory, a die memory, a controller, and a plurality of accumulators including a first accumulator and a second accumulator. The controller is configured to store first data in the controller memory, to transfer second data to the die memory over a bus having an n-bit width, and to compare n bits of the first data with n bits of the second data to produce n bit results. The plurality of accumulators each correspond to one of the n bit results. The controller is further configured to update the first accumulator in response to a first one of the n bit results indicating a first mismatch, and to simultaneously update the second accumulator in response to a second one of the n bit results indicating a second mismatch. Moreover, the controller is further configured to determine whether at least one of a first value of the first accumulator or a second value of the second accumulator does not meet an entropy threshold, and to identify an error associated with the second data based on the determination.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Figure 4A:
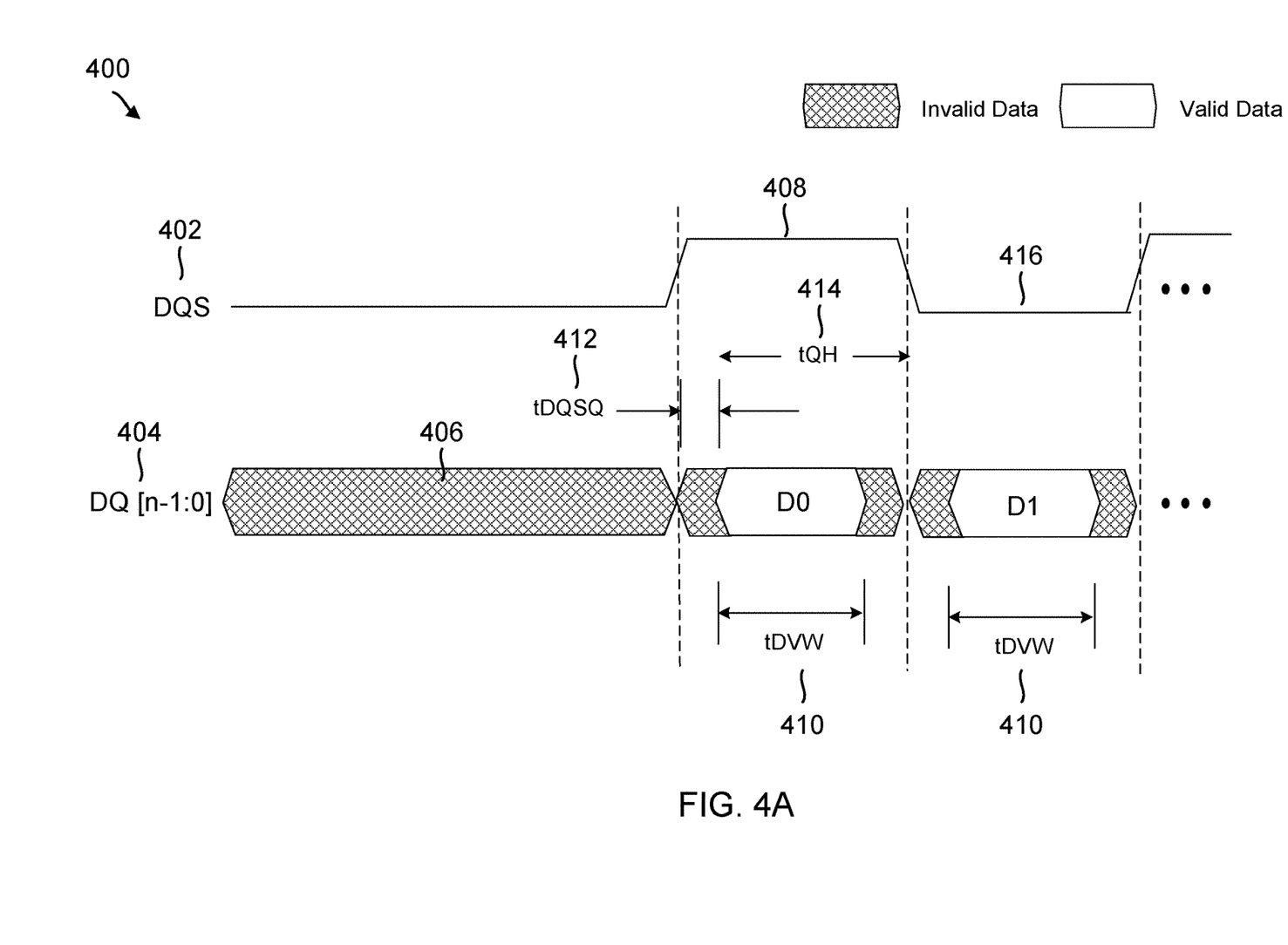
FIGS. 4A and 4B are conceptual diagrams illustrating example DQ and DQS timing charts during a read performed by the storage device of FIG. 1.

When a controller of the storage device reads data from a die, the controller may receive individual bits of the data simultaneously over multiple data outputs (DQs). Each unit of data, e.g. a byte for an 8-bit bus with 8 DQs, may be output in synchronization with each toggle of a data strobe (DQS). For example, when the DQS is toggled from logic 0 to logic 1, the controller may read a first byte from the die while the DQS is logic 1, and when the DQS is toggled from logic 1 back to logic 0, the controller may read a second byte from the die while the DQS is logic 0. An example is illustrated in FIG. 4A, in which the controller may read, assuming n=8, byte D0 during a first toggle of the DQS and byte D1 during a second toggle of the DQs. The controller may continue to read subsequent bytes after each DQS toggle (or other units of data according to the n-bit bus width, where n corresponds to the number of DQs).

Figure 4B:
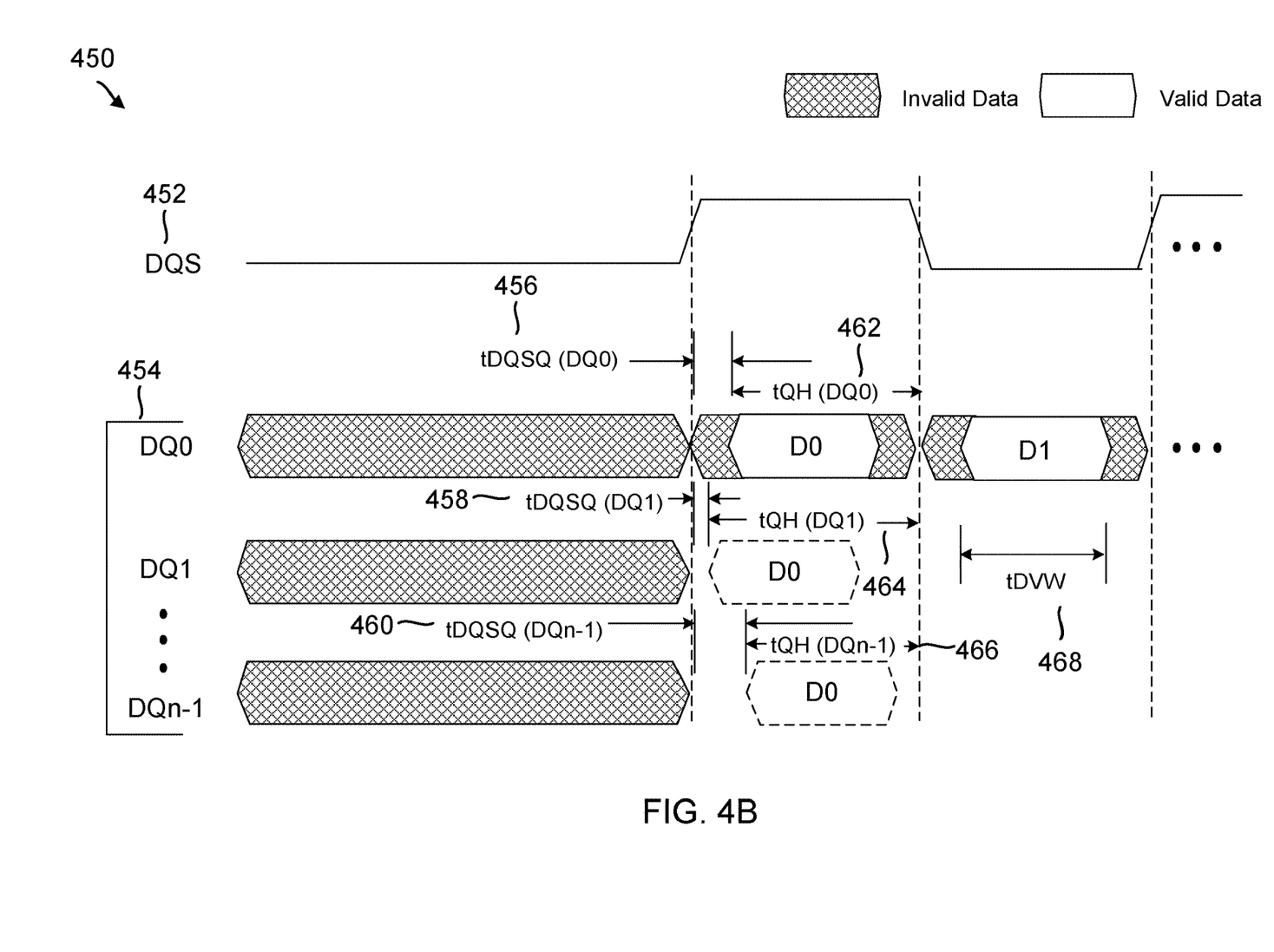

However, in some cases, the timing of one or more DQs may be offset with respect to a timing of the DQS. For example, different DQ pins may have different trace lengths between the controller and the NAND, and thus data may be output faster over one DQ than another. An example is shown in FIG. 4B, which illustrates multiple DQs 0, 1, . . . n−1 having different DQS timing offsets, e.g. separate DQS-DQ skew times (tDQSQ) and separate DQS-DQ hold times (tQH). For instance, assuming n=8, DQ0 may have a longer trace length than DQ1 and thus may be output later than DQ1 with respect to the DQS (e.g. with a larger tDQSQ or a smaller tQH), while DQ0 may have a shorter trace length than DQ7 and thus may be output earlier than DQ7 with respect to the DQS (e.g. after a smaller tDQSQ or a larger tQH). As the validity of data is most ensured within the center of each DQS toggle, such misalignment of DQ-DQS timings may result in data output errors, especially when the storage device operates at higher speeds or higher frequency DQS such as at least 533 mega transfers per second (MT/s). Misalignment of DQ-DQS by even a small percentage (e.g. 5% to 15%) at such speeds may result in an increased rate of uncorrectable errors, degraded quality of Service (QoS), and affected performance of the storage device.

To align the timing of each DQ with respect to the DQS and thus reduce read errors, the controller may calibrate the DQs (i.e. perform read centering, training or DQ tuning) such that the output of each DQ is centered with respect to each DQS toggle. During read training, the controller may increase or decrease an internal read delay register for each DQ (e.g. change the value of tDQSQ and/or tQH) until the DQs are all aligned. For instance, in the example of FIG. 4B, assuming n=8, the controller may align all the DQs with the center of each toggle of the DQS by, for example, maintaining tDQSQ and tQH for DQ0, increasing tDQSQ and/or decreasing tQH for DQ1, and decreasing tDQSQ and/or increasing tQH for DQ7. Accordingly, after read training, the controller may read two bytes of data D0, D1 (or some other unit of data depending on the width of the bus) in alignment with a 50/50 duty cycle of the DQS, as illustrated in the example of FIG. 4A. The controller may perform DQ training at the time of manufacture and periodically during operation of the storage device, for instance, when the storage device exceeds a set temperature threshold.

When the controller performs read training, in one example approach, the controller may assess each DQ pin serially. For instance, the controller may compare data output from the DQs with a test pattern, and if a single bit of the data output is different than a corresponding bit of the test pattern, the controller may flag this difference as an error and align the DQS-DQ timing for the erroneous DQ. The controller may then re-compare the data output from the DQs with the test pattern, and if another single bit of the data output is different than another corresponding bit of the test pattern, the controller may flag this difference as another error and align the DQS-DQ timing for that erroneous DQ well. The controller may similarly repeat the aforementioned process serially for each DQ until every DQ is aligned with the DQS.

However, such serial approaches may take substantial time at the manufacturing stage and may be cost-ineffective. For example, the above described, serial approach for read training may take a few minutes of time for a single die on a single storage device. As hundreds of thousands of storage devices may each be manufactured with multiple dies, performing such serial read training on every die may take significant time and cost to calibrate the devices.

Figure 5:
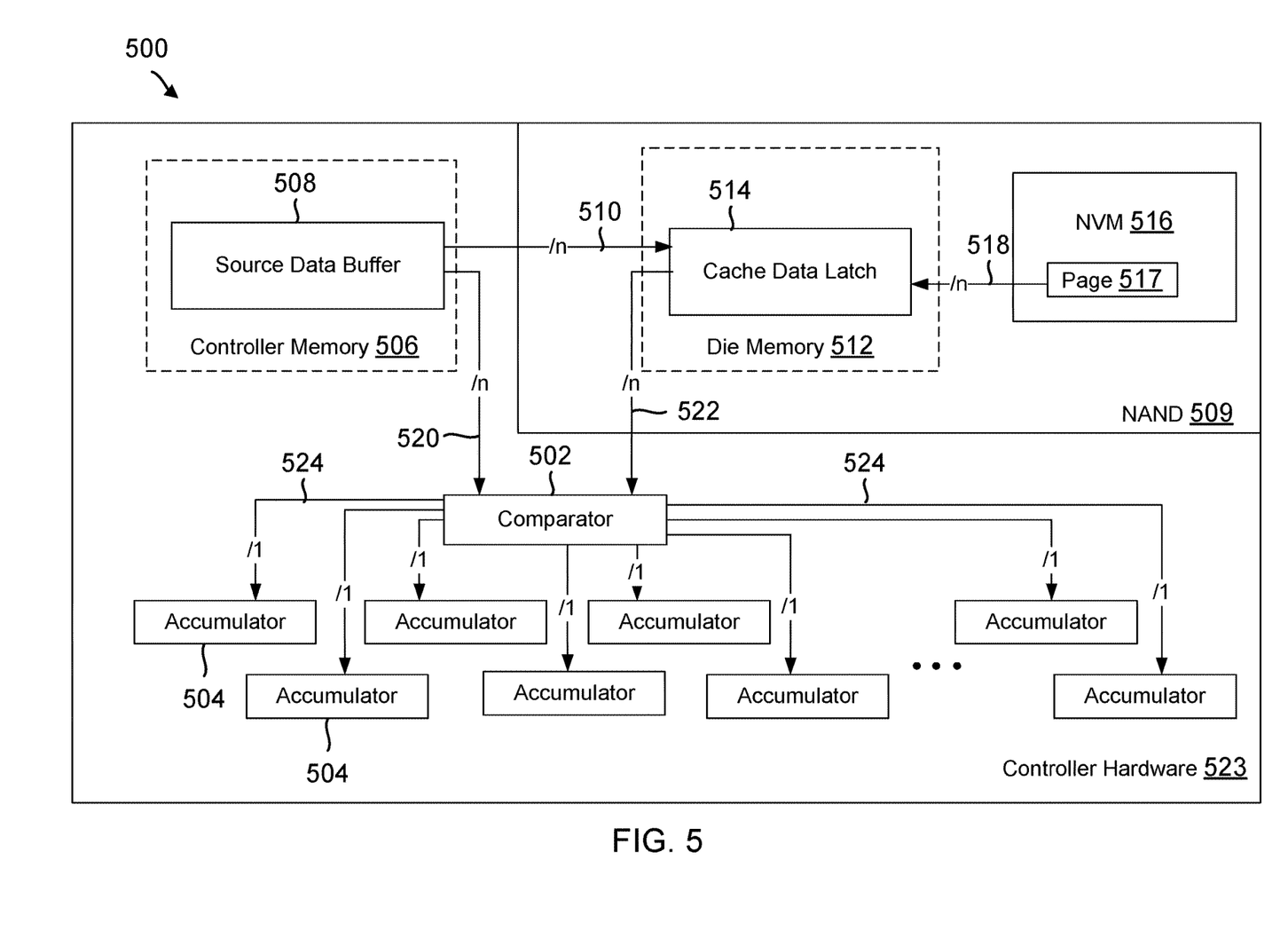
FIG. 5 is a conceptual diagram illustrating an example of a comparator and a plurality of accumulators for performing DQ training or page error detection in the storage device of FIG. 1.

To reduce the time and costs involved during the read training process, the present disclosure provides a parallel approach for read training using a plurality of accumulators each corresponding to a particular bit or DQ. When the controller compares a test pattern and data output from the DQs, the accumulators simultaneously count a number of mismatches between the test pattern and the data output in parallel, such that a number of bit errors for multiple DQs may be identified after one comparison. An example using this approach is illustrated in FIG. 5, discussed below.

In one example, the controller first stores data (e.g. a test pattern) in a source data buffer of a controller memory. Next, the controller transfers the data to a cache data latch in a die memory (e.g. a volatile memory such as a cache of the die). For instance, the controller may transfer the test pattern to the die over a shared n-bit bus via n DQs. Then, the controller reads the previously transferred data from the DQs n bits at a time, after which a comparator such as an XOR engine compares the n bits of the output data with a corresponding n bits of the data in the source data buffer. For example, where the storage device includes an 8-bit bus with 8 DQs, the comparator may compare each byte of the output data with each byte of the source data buffer. If any of the bits of the output data do not match the corresponding bits from the source data buffer, the accumulators associated with the DQs corresponding to the mismatched bits are simultaneously updated.

For instance, assuming an 8-bit bus (8 DQs), the source data buffer may include an alternating pattern of 1's and 0's (10101010 . . . ), amounting to 16 KB in total. The controller may transfer the 16 KB pattern to the cache data latch in the die, and the controller may read the 16 KB pattern back from the die, 8 bits at a time. However, due to DQS-DQ timing misalignment, some of the data bits may be flipped due to output errors. For instance, the first 8 bits output from the DQs[7:0] may not be 10101010 as expected, but may be 10001000 (i.e. indicating DQ1 and DQ5 are misaligned with DQS). Therefore, when the comparator compares the first 8 bits from the source data buffer (10101010) with the first 8 bits output from the DQs (10001000), the accumulators associated with DQ1 and DQ5 may be simultaneously updated in response to the mismatched bits. The process may repeat for each set of 8 bits until all 16 KB have been compared, at which point the eight accumulators respectively associated with DQ0-7 may have different values depending on the timing misalignment of individual DQs.

Thus, each accumulator may include a value corresponding to a number of errors for an associated DQ, and if the controller determines that the value of any of the accumulators meet a certain threshold (i.e. a mismatch threshold), the DQS-DQ timings for erroneous DQs may be adjusted based on the value of the respective accumulators. For instance, an accumulator with a larger value may indicate more adjustment is to be made for an associated DQ (e.g. due to more errors and thus likely more misalignment), while an accumulator with a smaller value may indicate less or no adjustment is to be made for an associated DQ (e.g. due to less or no errors and thus likely less or no misalignment). Accordingly, once the comparison and parallel accumulation are complete, the controller may adjust the DQS-DQ timings for each DQ based on its associated accumulator value, thereby allowing read training to be performed more quickly and thus more cost-effectively than the serial approach described above.

Additionally, while the plurality of accumulators in the above example are used for identification of DQS-DQ timing errors, the present disclosure is not so limited. For example, the plurality of accumulators may be similarly used for identification of page errors in the NAND. When the controller writes data to be stored as a page, the data is generally scrambled to improve data reliability and minimize bit errors. For instance, the data may be scrambled with an equal number of zeros and ones before it is stored (i.e. the data includes a 50% bit entropy). However, if there is a defect associated with a word line for the page or the bit lines, if there is a problem with the scrambling, or if some other error occurs resulting in erroneous flipped bits, the number of zeros and ones may no longer be equal. As a result, the present disclosure allows the controller to detect whether such an error has occurred similarly using the plurality of accumulators. For example, the controller may read the scrambled data from the page of the NAND, compare the data to a test pattern (e.g. all 1's or all 0's) using the comparator, and accumulate a number of mismatches for each bit using the plurality of accumulators. If any of the values in the accumulators do not meet a certain threshold (e.g. an entropy threshold), the controller may determine that a page read error has occurred.

For instance, assuming an 8-bit bus (8 DQs) and a page size of 16 KB, the source data buffer may include a pattern of 1's (11111111 . . . ) or 0's (00000000 . . . ), amounting to 16 KB or 128000 bits in total. The controller may read a scrambled 16 KB page from the NAND into the cache data latch, after which the scrambled page is output from the die, 8 bits at a time. Assuming 50% bit entropy, the 16 KB page may be expected to include 64000 bits of logic 1 and 64000 bits of logic 0. For instance, the page may include a pattern of alternating 1's and 0's. Thus, when the full 16 KB of data in the source data buffer and the cache data latch are compared, 64000 mismatches are expected to occur (8000 for each DQ), and thus each accumulator is expected to have a value equal to 8000 (the entropy threshold in this example). Accordingly, when the comparator compares the bits from the source data buffer with the bits output from the DQs, the accumulators associated with the DQs may be simultaneously updated in response to expected mismatched bits. The process may repeat for each set of bits until all 16 KB have been compared, at which point the accumulators respectively associated with the DQs are all expected to each have a value equal to the entropy threshold (e.g. 8000). However, due to word line errors, bit line errors, or scrambling errors, some of the data bits may be flipped. For instance, the first 8 bits output from the DQs[7:0] may not be 10101010 as expected, but may be 10101001 (i.e. indicating an error with the bits output from DQ1 and DQ0, assuming the DQS-DQ timings are aligned). Thus, the accumulators at least associated with DQ1 and DQ0 may have a different value than 8000 and thus do not meet the entropy threshold. As a result, the controller may determine that an error associated with the page has occurred, and the controller may perform error handling accordingly.

Figure 1:
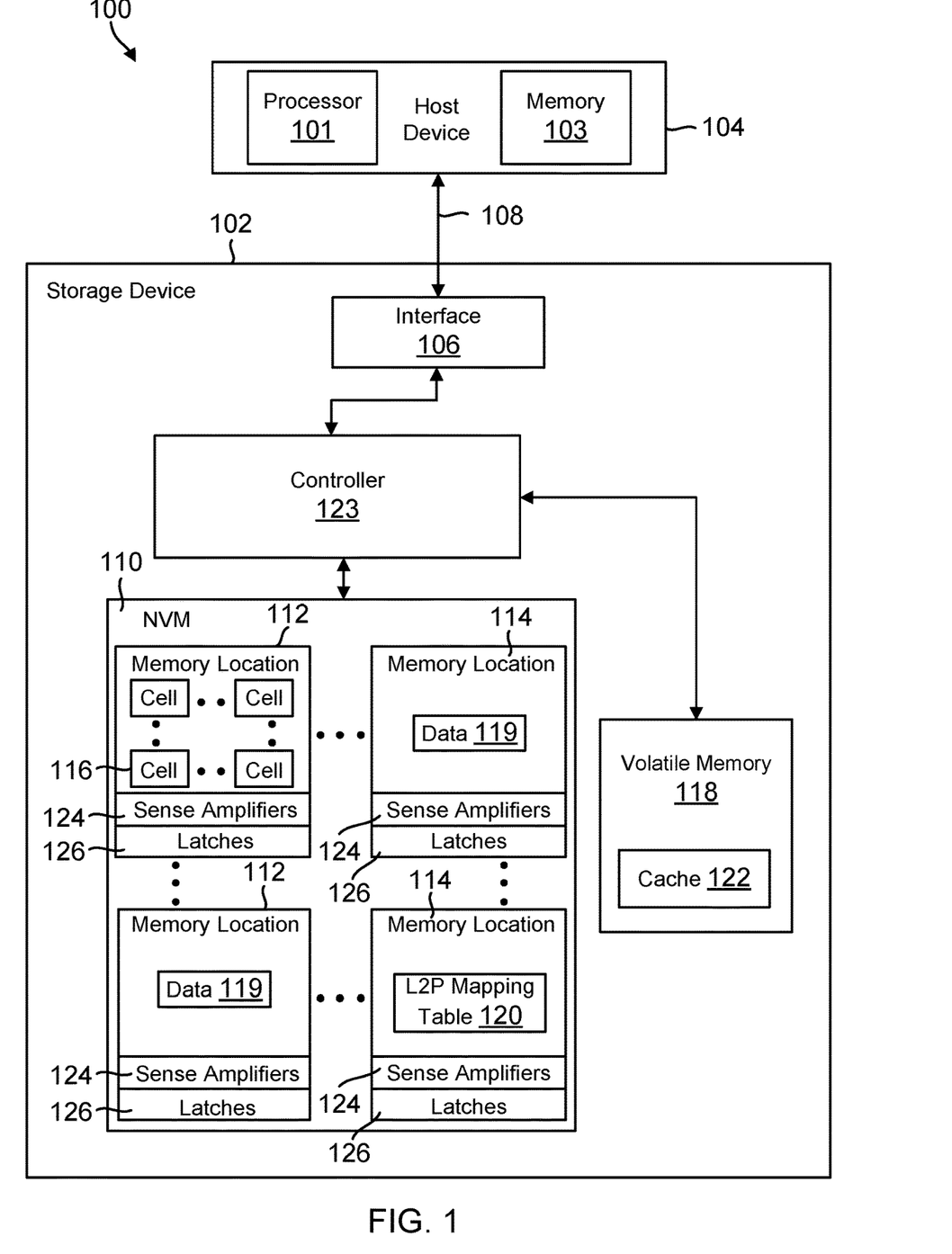
FIG. 1 is a block diagram illustrating an exemplary embodiment of a storage device in communication with a host device.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
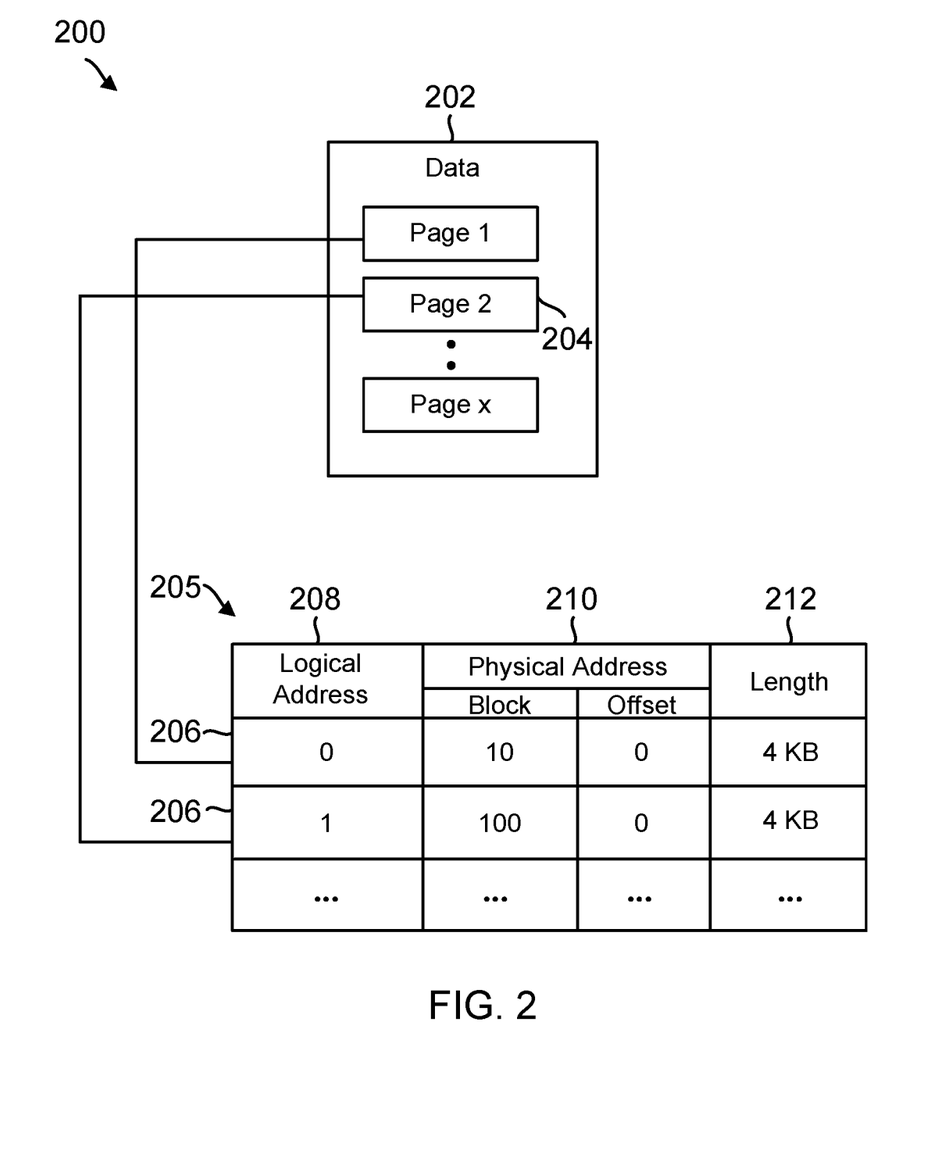
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
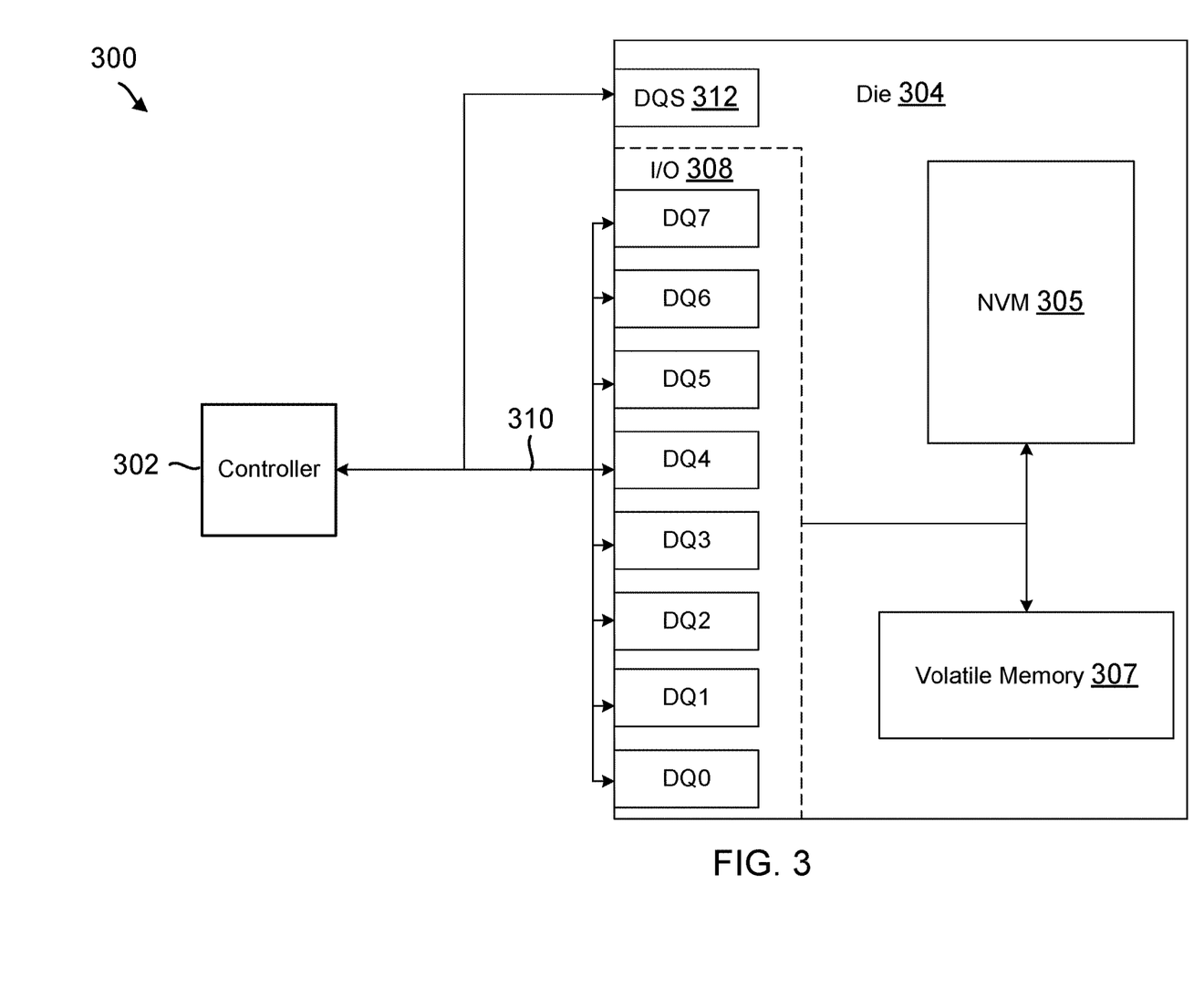
FIG. 3 is a conceptual diagram illustrating an example of a die in communication with a controller in the storage device of FIG. 1.

FIG. 3 illustrates an example diagram 300 illustrating a controller 302 in communication with a die 304 over a bus 306. Die 304 may include a NVM 305 that stores data (e.g. data 119 of FIG. 1), and a volatile memory 307. The controller 302 may correspond to controller 123 of FIG. 1, and the NVM 305 of die 304 may correspond to the memory location 112 of FIG. 1. Each die may include various pins which serve as interfaces between the controller and the die. For example, the die may include an input/output (I/O) 308 which is configured to receive inputs and transmit outputs (e.g. input data and commands from the controller to read, write, or erase data, and output data from the NVM 305 or volatile memory 307). I/O 308 may include a number of data lines or pins (DQ) that receive individual bits of input data and send individual bits of output data over a shared bus 310. In the example of FIG. 3, shared bus 310 may be an 8-bit bus which interfaces with eight DQ pins (DQ7:0), although a different bus width and number of DQs may be used (e.g. a 16-bit bus with 16 DQs). The die may also include a bidirectional data strobe signal (DQS) 312 that clocks the I/O 308 to receive and transmit data over the shared bus 310. For clarity, only I/O 308 and DQS 312 are illustrated in FIG. 3 for die 304; however die 304 may include other pins. For instance, the die may include a CE for receiving a chip-enable signal from the controller, a ready/busy (R/B) for outputting a ready or busy status to the controller, an address latch enable (ALE) for latching addresses into NAND, a command latch enable (CLE) for latching commands into a command register, a RE (read enable) for enabling output data buffers, and a WE (write enable) for clocking data, addresses, or commands into the NAND. Moreover, while FIG. 3 illustrates a single die in communication with the controller 302, multiple dies may communicate with the controller over bus 306.

When the controller 123, 302 reads data 119 from the die 304 including the NVM 110, 305 as described above, the controller receives output data from the DQs in I/O 308 during each toggle of the DQS 312. FIG. 4A illustrates a timing chart 400 depicting an example of this timing relationship between a DQS 402 (e.g. DQS 312) and n DQs 404 (e.g. DQs in I/O 308) during a read. The value n may be 8 similar to the example of FIG. 3 (e.g. DQ[7:0] corresponding to eight DQs sharing an 8-bit bus), or another number (e.g. 16, etc.). During a time 406, the die may perform internal processing of data to be output to the controller. When the DQS 402 toggles at time 408, the controller may read n bits of data D0 from the DQs 404 (over shared bus 310) within a data valid window 410, which may be calculated as the difference between a DQS-DQ signal skew timing 412 (tDQSQ) and a DQS-DQ signal hold timing 414 (tQH). When the DQS 402 toggles again at time 416, the controller may read the next n bits of data D1 from the DQs 404 within the next data valid window, and the process may repeat for subsequent n bits of data after each toggle of DQS 402.

Generally, each DQ is center aligned with respect to the DQS toggles to account for setup and hold times and reduce the likelihood of data read errors. However, as each DQ may have a different trace length between the controller and the die, the DQs may have different data output alignments with respect to the DQS. FIG. 4B illustrates a timing chart 450 depicting an example of this timing relationship between a DQS 452 (e.g. 312) and n DQs 454 (e.g. DQs in I/O 308) during a read. The timing chart is similar to that of FIG. 4A; however, in this example, DQ1 may be output earlier than DQ0 due to a shorter trace length, while DQn−1 may be output later than DQ0 due to a longer trace length. This misalignment may be represented by different tDQSQs for each DQ 454, as illustrated in FIG. 4B. For example, DQ0 may have a respective tDQSQ 456, DQ1 may have a respective tDQSQ 458, and DQn−1 may have a respective tDQSQ 460. To maintain uniform sizing of the data valid window, the different tDQSQs may result in different tQHs for each DQ. For example, DQ0 may have a respective tQH 462, DQ1 may have a respective tQH 464, and DQn−1 may have a respective tQH 466. In such case, although each DQ may be sufficiently aligned with respect to the center of each DQS toggle at lower DQS speeds, the DQs may not be properly aligned at higher DQS speeds (e.g. greater than 533 MT/s) due to shorter DQS wavelengths. To reduce the likelihood of data read errors as a result, the controller may perform read centering or training by adjusting each tDQSQ 456, 458, 460 (or tQH 462, 464, 466) until the DQs are aligned with respect to the center of each DQS toggle (e.g. within data valid window 468).

FIG. 5 illustrates an example 500 of comparator 502 and a plurality of accumulators 504 which may be used when performing read training of the DQs. A controller (e.g. controller 123, 302) may include a controller memory 506 (e.g. volatile memory 118) that includes a source data buffer 508. The source data buffer 508 may be implemented in firmware/software, or in hardware (e.g. as a register or data latch). The source data buffer 508 may store a pattern for read training (e.g. alternating 1's and 0's, or some other configured test pattern by the controller).

The controller may communicate with a NAND die 509 (e.g. die 304) over an n-bit bus 510 (e.g. shared bus 310 of FIG. 3, where n=8 or some other number corresponding to a number of DQs 404, 454). The die 509 may include a die memory 512 (e.g. volatile memory 307) that includes a cache data latch 514, and a NVM 516 (e.g. NVM 110, 305) that stores the data to be read by the controller in one or more pages 517. The cache data latch 514 may store data transferred from the controller memory 506 over the n-bit bus 510. The cache data latch 514 may also store data transferred from the NVM 516 over another n-bit bus 518 between the die memory 512 and the NVM 516. The cache data latch 514 may be, for example, a NAND latch circuit (XDL). In one example, the source data buffer 508 and cache data latch 514 may each store 16 KB of data. However, the source data buffer 508 and cache data latch 514 may store other amounts of data in other examples (e.g. 32 KB, etc.).

The comparator 502 may receive, as an input, n bits of data 520 from the source data buffer 508 and n bits of data 522 from the cache data latch 514, where n is the same as the number of bits carried over n-bit bus 510. The comparator 502 may be implemented in controller hardware 523 as illustrated in FIG. 5, or alternatively in firmware/software (e.g. as an XOR or XNOR operand). For instance, the comparator 502 may include XOR gates or XNOR gates that are wired to the source data buffer 508 and the cache data latch 514. The length of comparator 502 may correspond to the width of the n-bit bus 510. For example, if n-bit bus 510 has a width of 8 bits, the comparator 502 may include 8 XOR or XNOR gates which respectively receive individual bits from the source data buffer and the cache data latch. The comparator 502 may compare each byte (or other unit of data 520, 522) of the source data buffer and cache data latch at the same bit offset. For instance, one XOR gate of the comparator 502 may compare the most significant bits of data 520, 522 received from the source data buffer and cache data latch, another XOR gate of the comparator may compare the next significant bits of data 520, 522 from the source data buffer and cache data latch, etc. Thus, the comparator 502 may output n-bit results 524. For example, assuming an 8-bit bus width with 8 XOR/XNOR gate of comparator 502, eight 1-bit outputs (i.e. results 524) of comparator 502 may result as illustrated in the example of FIG. 5.

The plurality of accumulators 504 may each receive, as an input, one of the n-bit results 524 from the comparator 502. The accumulators may be implemented in the controller hardware 523 as illustrated in FIG. 5. For instance, each accumulator 504 may be a separate counter or register that is wired to an output (result 524) of one of the XOR/XNOR gates of the comparator 502. For example, if n-bit bus 510 has a width of 8 bits and the comparator 502 includes 8 XOR gates, eight accumulators may be individually wired to each of the respective XOR gates, as illustrated in FIG. 5. The accumulators may also be designed with sufficient capacity to accommodate a length of the data stored in the source data buffer 508 and/or cache data latch 514. For instance, if the source data buffer and cache data latch each store 16 KB of data, the accumulator 504 associated with each bit or DQ may be configured to count up to 16 bits (e.g. using sixteen connected D flip flops or JK flip flops, or in some other manner).

Each accumulator 504 may be incremented in response to mismatch of input bits of data 520, 522 at the respective XOR/XNOR gate of comparator 502. For instance, if the comparator 502 includes 8 XOR gates and the most significant bits of data 520, 522 from the source data buffer 508 and the cache data latch 514 of a particular byte do not match (e.g. one is a logic 0 and the other is a logic 1), the XOR gate that receives those bits will output a logic 1 as its corresponding result 524. Similarly, if the comparator includes XNOR gates, the XNOR gate that receives those bits may output a logic 0. The accumulator wired to the respective XOR/XNOR gate may then be incremented in response to the gate output. For instance, each accumulator 504 may be wired to a respective XOR gate such that the output of the XOR gate (result 524) is received as a clock input for the corresponding accumulator. In such case, each accumulator may increment a stored value in response to its clock going high as a result of a logic 1 XOR output from comparator 502, or in response to its clock going low as a result of a logic 0 XNOR output from comparator 502. The accumulators 504 may alternatively be designed to increment based on the comparator results in other ways.

In one example of operation, the plurality of accumulators 504 may be used for read training. In this example, the controller stores a test pattern in the source data buffer 508. The controller then writes the test pattern to the cache data latch 514 over the n-bit bus 510. Afterwards, the controller reads the data back from the cache data latch 514, during which the controller compares n bits of data 520 from the source data buffer 508 with the n bits of data 522 read from the cache data latch 514. The n bits of data 522 received from the cache data latch 514 may correspond to one of the individual units of data illustrated in FIG. 4B which is received from the DQs (e.g. D0, D1, etc.). Although each n bits of data 522 received from the cache data latch 514 should match the n bits of data 520 received from the source data buffer 508, errors in the n bits of data 522 may arise due to DQS-DQ timing misalignment as described above. To detect the misaligned DQs, the comparator 502 compares each set of n bits of data 520, 522 from the source data buffer 508 and the cache data latch 514, and if a data mismatch occurs, each accumulator 504 associated with a respective bit is updated to represent the respective data mismatch. For instance, in the 8-bit example described above, 8 XOR gates in the comparator 502 may simultaneously compare corresponding bits of data 520, 522, and if multiple mismatches are individually detected, the associated accumulators 504 may be updated in parallel based on the results 524. The process may repeat for each set of n bits until all data in the source data buffer 508 and the cache data latch 514 have been compared and the accumulators 504 have been finally updated.

After comparing the data, the controller may obtain the values in each accumulator 504 and compare each value against a threshold (e.g. 5 or some other configured number of mismatches) to determine whether DQS-DQ timing misalignment exists for a particular DQ. If any of the values in the accumulators 504 meet the threshold (e.g. they are 5 or larger in this example), the controller may adjust the DQS-DQ timing for the bits/DQs associated with those accumulators as described above (e.g. by updating an internal delay register in the die for those tDQSQs or tQHs). The timing adjustment of tDQSQ or tQH may be larger for DQs with higher accumulator values and smaller for DQs with lower accumulator values. The controller may then reset the accumulators and repeat the process above until no accumulator values meet the threshold, indicating that all DQS-DQ timings have been aligned and read training has been completed.

In another example of operation, the plurality of accumulators 504 may be used for page error detection. In this example, the controller stores a test pattern in the source data buffer 508 (e.g. all logic 0's or 1's). The controller then reads a scrambled page (e.g. page 517) from the NVM 516 to the cache data latch 514 over the n-bit bus 518. Afterwards, the controller reads the data from the cache data latch 514, during which the controller compares n bits of data 520 from the source data buffer 508 with n bits of data 522 from the cache data latch 514. Assuming 50% bit entropy in this example, the scrambled page may be expected to include the same number of logic 0's and logic 1's, but the result may be different due to page read errors, bit line errors, scrambler errors, etc. To detect such errors, the comparator 502 compares each set of n bits of data 520, 522 from the source data buffer 508 and the cache data latch 514, and if a data mismatch occurs, each accumulator 504 associated with a respective bit is updated to represent the respective data mismatch. For instance, in the 8-bit example described above, 8 XOR gates in the comparator may simultaneously compare corresponding bits, and if multiple mismatches are detected, the associated accumulators 504 may be updated in parallel based on the results 524. The process may repeat for each set of n bits until all data in the source data buffer 508 and the cache data latch 514 have been compared and the accumulators 504 have been finally updated.

After comparing the data, the controller may obtain the values in each accumulator 504 and compare each value against an entropy threshold (e.g. 8000 or some other number based on a bit entropy percentage (e.g. 50%) and a length of the page (e.g. 16 KB) as described above) to determine whether an error exists for that particular page. If any of the values in the accumulators do not meet the threshold (e.g. they are either smaller or larger than 8000 in this example), the controller may determine that one or more bits corresponding to the accumulators were flipped during the page read, which may indicate an error associated with the page, a bit line error, or a scrambling error. The controller may then handle the error accordingly. After resetting the accumulators, the controller may repeat the process above to detect other errors associated with other pages.

Figure 6:
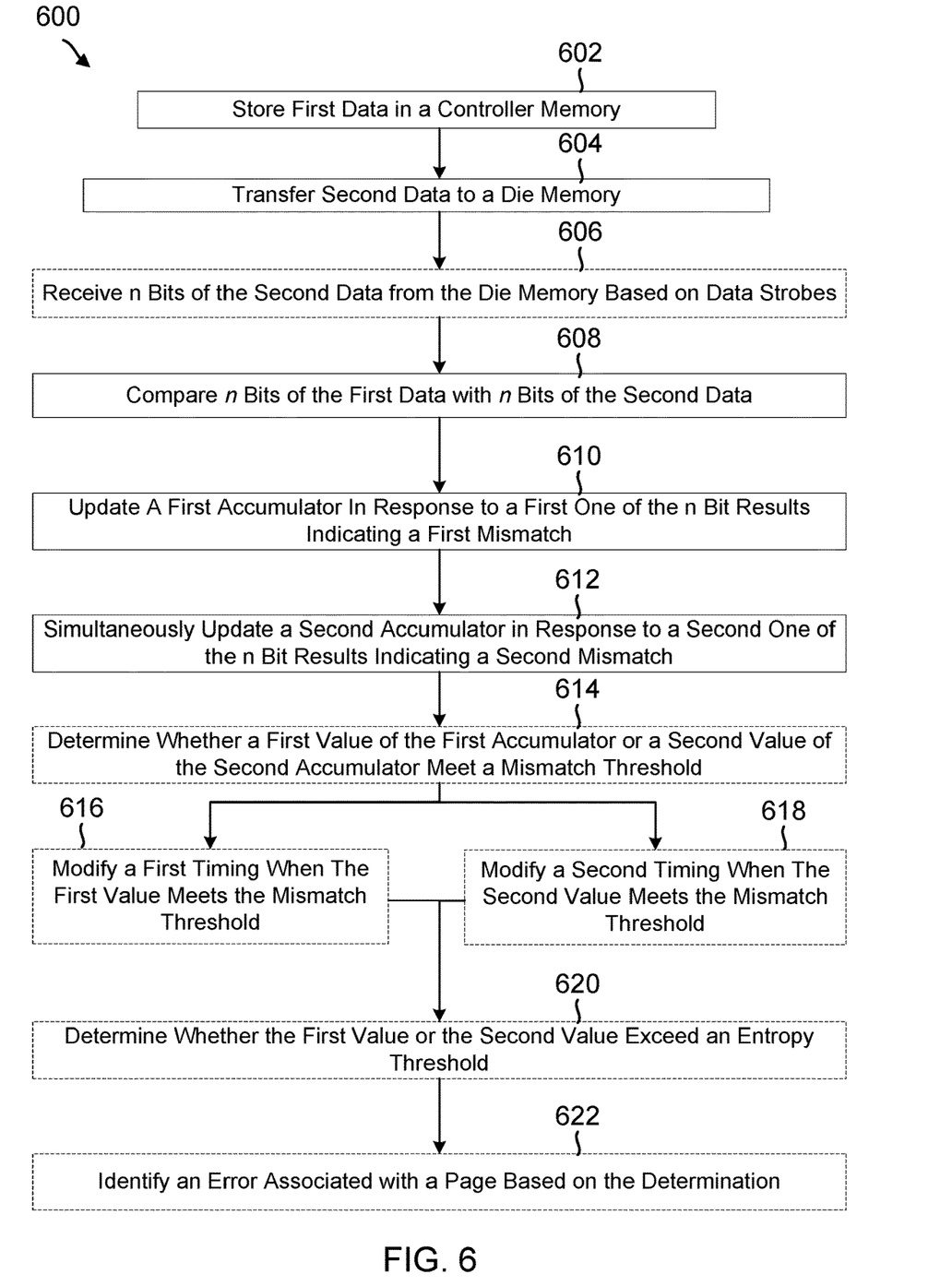
FIG. 6 is a flow chart illustrating a method for performing DQ training or page error detection using a plurality of accumulators in the storage device of FIG. 1.

FIG. 6 illustrates an example flow chart 600 of a method for performing read training and identifying page errors using a comparator and a plurality of accumulators. For example, the method can be carried out in a storage device 102 such as the one illustrated in FIG. 1. Each of the steps in the flow chart can be controlled using the controller as described below (e.g. controller 123, 302), or by some other suitable means. Optional aspects are illustrated in dashed lines.

As represented by block 602, the controller stores first data in a controller memory. For example, referring to FIG. 5, the controller may store a test pattern of alternating 1's and 0's (for DQ training) or a pattern of only 1's or only 0's (for page read error detection) in source data buffer 508 of controller memory 506.

As represented by block 604, the controller transfers second data to a die memory over a bus having an n-bit width. In one example, the second data transferred to the die memory may comprise the first data. In another example, the second data transferred to the die memory may comprise a page from a non-volatile memory. For instance, referring to FIG. 5, the controller may transfer the test pattern stored in the source data buffer 508 over n-bit bus 510 (e.g. shared bus 310 including an 8-bit width or some other number) to the cache data latch 514 in die memory 512. Alternatively, the controller may transfer scrambled data from a page 517 of the NVM 516 over n-bit bus 518 to the cache data latch 514 in die memory 512.

As represented by block 606, the controller may receive the n bits of the second data from the die memory based on a data strobe. The data strobe may be offset with respect to a first one of the n bits of the second data by a first timing, and the data strobe may be offset with respect to a second one of the n bits of the second data by a second timing. For example, referring to FIGS. 4A, 4B, and 5, comparator 502 in the controller hardware 523 of the controller may receive n-bits of data 522 from the die memory 512 via DQs 404, 454 in timing with DQS 402, 452. The DQS may be offset with respect to the DQs by different timings. For instance, referring to FIGS. 4B and 5, one of the n bits of data 522 corresponding to DQ0 may be offset with respect to the DQS 452 by a first timing (e.g. tDQSQ 456 or tQH 462), while another of the n bits of data 522 corresponding to DQ1 may be offset with respect to the DQS 452 by a second timing (e.g. tDQSQ 458 or tQH 464).

As represented by block 608, the controller compares n bits of the first data with n bits of the second data to produce n bit results. The controller may compare the first data with the second data using one or more exclusive-or (XOR) gates or exclusive-nor (XNOR) gates. For example, referring to FIG. 5, the comparator 502 in the controller hardware 523 may compare n bits of data 520 from the source data buffer 508 with n bits of data 522 from the cache data latch 514 to produce n bit results 524. The comparator 502 may include a number of XOR gates or XNOR gates corresponding to the width of the n-bit bus 510. For instance, if the n-bit bus 510 includes a width of 8 bits, the comparator 502 may compare each byte from the source data buffer 508 with each corresponding byte from the cache data latch 514 using eight XOR or XNOR gates (one for each bit).

As represented by block 610, the controller may update a plurality of accumulators each corresponding to one of the n bit results. The controller updates a first accumulator of the plurality of accumulators in response to a first one of the n bit results indicating a first mismatch. Similarly, as represented by block 612, the controller simultaneously updates a second accumulator in response to a second one of the n bit results indicating a second mismatch. For example, referring to FIG. 5, a plurality of accumulators 504 in controller hardware 523 may respectively receive the n-bit results 524 of comparator 502. For instance, assuming n=8, then eight bit results (i.e. eight separate 1-bit results, one from each XOR/XNOR gate of comparator 502) may be output in parallel to the accumulators 504. Each of the eight single-bit results are in response to a comparison of data 520 with the data 522 received via the eight DQs. Thus, each single-bit result corresponds to one of the DQs, and the respective accumulator that receives the result similarly corresponds to that DQ. If any mismatches exist between the corresponding bits of data 520, 522, the respective accumulator is updated accordingly based on the comparator output. For example, assuming n=8, if a mismatch is detected between the most significant bit of data 520 and the most significant bit of data 522 (e.g. received via DQ7), the accumulator associated with DQ7 may be updated (e.g. incremented) in response to the corresponding comparator output. Likewise, during the same comparison of data 520, 522, if another mismatch is detected in parallel between the next significant bit of data 520 and the next significant bit of data 522 (e.g. received via DQ6), the accumulator associated with DQ6 may be simultaneously updated (e.g. incremented) in response to the corresponding comparator output. Thus, if mismatches exist between all 8 bits, all the accumulators may be simultaneously updated in response to one comparison.

In one example, when the second data transferred to the die memory comprises the first data, then as represented by block 614, the controller may determine whether a first value of the first accumulator or a second value of the second accumulator meet a mismatch threshold. If so, then as represented by block 616, the controller may modify the first timing relating to the data strobe offset for the first one of the n bits of the second data when the first value meets the mismatch threshold, and as represented by block 618, the controller may modify the second timing relating to the data strobe offset for the second one of the n bits of the second data when the second value meets the mismatch threshold. The controller may modify the first timing based on the first value and the second timing based on the second value. For example, referring to FIGS. 4B and 5, the controller may determine whether the value in each accumulator 504 meets a mismatch threshold (e.g. 5 or some other configured number of mismatches). If any of the values meet the mismatch threshold, the controller may update the DQS-DQ timing (e.g. tDQSQ 456, 458, 460 or tQH 462, 464, 466) corresponding to the associated accumulator for that DQ 454. For example, after comparing all the data in source data buffer 508 and cache data latch 514 (in multiple sets of n bits of data 520, 522), the accumulator corresponding to DQ1 and DQn−1 may each have an updated value greater than or equal to the mismatch threshold, as indicated by the misaligned timings illustrated in FIG. 4B. Therefore, once the controller determines that the accumulator values for these DQs meet the threshold, the controller may modify tDQSQ 458, 460 and/or tQH 464, 466 (e.g. by adjusting internal delay register(s) for the die) until the timings of the DQs are all aligned as illustrated in FIG. 4A.

In another example, when the second data transferred to the die memory comprises a page from a non-volatile memory, then as represented by block 620, the controller may determine whether at least one of a first value of the first accumulator or a second value of the second accumulator does not meet an entropy threshold. If so, then as represented by block 622, the controller may identify an error associated with the page based on the determination. For example, referring to FIG. 5, after comparing the data, the controller may obtain the values in each accumulator 504 and compare each value against an entropy threshold (e.g. 8000 or some other number based on a bit entropy percentage (e.g. 50%) and a length of the page (e.g. 16 KB) as described above). If any of the values in the accumulators 504 do not meet the threshold (e.g. they are either smaller or larger than 8000 in this example), the controller may determine that one or more bits corresponding to the accumulators were flipped during the page read, which may indicate an error associated with the page, a bit line error, or a scrambling error. The controller may then handle the error accordingly.

Accordingly, the present disclosure provides for fast DQ tuning or training by providing a plurality of accumulators which are simultaneously updated in parallel in response to bit errors due to DQS-DQ timing misalignment for different DQs. This parallel implementation saves manufacturing time and cost over the serial DQ training implementation described above. For example, in a storage device having an 8-bit bus with 8 DQs, the present disclosure allows DQS-DQ misalignments to be detected for 8 DQs in parallel rather than one DQ serially at a time, allowing for the read centering process to be completed in at least $\frac{1}{8}^{th}$ the time. This faster approach also provides increased QoS in variable temperature environments or other environments that may require regular re-tuning or calibration of the DQs during run time of the storage device. Additionally, the plurality of accumulators may serve other applications than DQ training including debugging controller (ASIC) and/or NAND errors based an expected bit entropy of a scrambled page (e.g. 50%), allowing for detection of an erroneous page, bit line, or bad block (for example) and subsequent handling or correction.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a controller memory and a die memory;
   a controller configured to store first data in the controller memory, to transfer second data to the die memory over a bus having an n-bit width, and to compare n bits of the first data with n bits of the second data to produce n bit results; and
   a plurality of accumulators each corresponding to one of the n bit results and including a first accumulator and a second accumulator;
   wherein the controller is further configured to update the first accumulator in response to a first one of the n bit results indicating a first mismatch, and to simultaneously update the second accumulator in response to a second one of the n bit results indicating a second mismatch.

2. The storage device of claim 1,
   wherein the controller is further configured to receive the n bits of the second data from the die memory based on a data strobe;
   wherein the data strobe is offset with respect to a first one of the n bits of the second data by a first timing, and wherein the data strobe is offset with respect to a second one of the n bits of the second data by a second timing; and
   wherein the controller is further configured to determine whether a first value of the first accumulator or a second value of the second accumulator meet a mismatch threshold, to modify the first timing when the first value meets the mismatch threshold, and to modify the second timing when the second value meets the mismatch threshold.

3. The storage device of claim 2, wherein the controller is further configured to modify the first timing based on the first value and to modify the second timing based on the second value.

4. The storage device of claim 1, wherein the second data transferred to the die memory comprises the first data.

5. The storage device of claim 1, wherein the second data transferred to the die memory comprises a page from a non-volatile memory.

6. The storage device of claim 5, wherein the controller is further configured to determine whether at least one of a first value of the first accumulator or a second value of the second accumulator does not meet an entropy threshold, and to identify an error associated with the page based on the determination.

7. The storage device of claim 1, wherein the controller is further configured to compare the first data with the second data using one or more exclusive-or (XOR) gates or exclusive-nor (XNOR) gates.

8. A storage device, comprising:
   a controller memory and a die memory;
   a controller configured to store first data in the controller memory, to transfer second data to the die memory over a bus having an n-bit width, to receive n bits of the second data from the die memory based on a data strobe, and to compare n bits of the first data with the n bits of the second data to produce n bit results, wherein the data strobe is offset with respect to a first one of the n bits of the second data by a first timing, and wherein the data strobe is offset with respect to a second one of the n bits of the second data by a second timing; and
   a plurality of accumulators each corresponding to one of the n bit results and including a first accumulator and a second accumulator, wherein the controller is further configured to update the first accumulator in response to a first one of the n bit results indicating a first mismatch, and to simultaneously update the second accumulator in response to a second one of the n bit results indicating a second mismatch;
   wherein the controller is further configured to determine whether a first value of the first accumulator or a second value of the second accumulator meet a mismatch threshold, to modify the first timing when the first value meets the mismatch threshold, and to modify the second timing when the second value meets the mismatch threshold.

9. The storage device of claim 8, wherein the controller is further configured to modify the first timing based on the first value and to modify the second timing based on the second value.

10. The storage device of claim 8, wherein the second data transferred to the die memory comprises the first data.

11. The storage device of claim 8, wherein the second data transferred to the die memory comprises a page from a non-volatile memory.

12. The storage device of claim 11, wherein the controller is further configured to determine whether at least one of the first value of the first accumulator or the second value of the second accumulator does not meet an entropy threshold, and to identify an error associated with the page based on the determination.

13. The storage device of claim 8, wherein the controller is further configured to compare the first data with the second data using one or more exclusive-or (XOR) gates or exclusive-nor (XNOR) gates.

14. A storage device, comprising:
a controller memory and a die memory;
a controller configured to store first data in the controller memory, to transfer second data to the die memory over a bus having an n-bit width, and to compare n bits of the first data with n bits of the second data to produce n bit results; and
a plurality of accumulators each corresponding to one of the n bit results and including a first accumulator and a second accumulator, wherein the controller is further configured to update the first accumulator in response to a first one of the n bit results indicating a first mismatch, and to simultaneously update the second accumulator in response to a second one of the n bit results indicating a second mismatch;
wherein the controller is further configured to determine whether at least one of a first value of the first accumulator or a second value of the second accumulator does not meet an entropy threshold, and to identify an error associated with the second data based on the determination.

15. The storage device of claim 14,
wherein the controller is further configured to receive the n bits of the second data from the die memory based on a data strobe;
wherein the data strobe is offset with respect to a first one of the n bits of the second data by a first timing, and wherein the data strobe is offset with respect to a second one of the n bits of the second data by a second timing; and
wherein the controller is further configured to determine whether the first value of the first accumulator or the second value of the second accumulator meet a mismatch threshold, to modify the first timing when the first value meets the mismatch threshold, and to modify the second timing when the second value meets the mismatch threshold.

16. The storage device of claim 15, wherein the controller is further configured to modify the first timing based on the first value and to modify the second timing based on the second value.

17. The storage device of claim 14, wherein the second data transferred to the die memory comprises the first data.

18. The storage device of claim 14, wherein the second data transferred to the die memory comprises a page from a non-volatile memory.

19. The storage device of claim 14, wherein the controller is further configured to compare the first data with the second data using one or more exclusive-or (XOR) gates.

20. The storage device of claim 14, wherein the controller is further configured to compare the first data with the second data using one or more exclusive-nor (XNOR) gates.

* * * * *